(12) United States Patent
Hino et al.

(10) Patent No.: US 7,332,744 B2
(45) Date of Patent: Feb. 19, 2008

(54) SEMICONDUCTOR LIGHT-EMITTING DEVICE AND METHOD OF MANUFACTURING THE SAME

(75) Inventors: Tomonori Hino, Kanagawa (JP); Hironobu Narui, Kanagawa (JP); Takayuki Kawasumi, Kanagawa (JP); Tsuyoshi Nagatake, Kanagawa (JP); Yuichi Kuromizu, Kanagawa (JP); Tadahiko Kawasaki, Tokyo (JP); Noriko Kobayashi, Kanagawa (JP); Masaki Shiozaki, Kanagawa (JP); Jugo Mitomo, Kanagawa (JP); Michiko Komine, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/983,927

(22) Filed: Nov. 8, 2004

(65) Prior Publication Data
US 2005/0139856 A1    Jun. 30, 2005

(30) Foreign Application Priority Data
Nov. 10, 2003    (JP)    ............................ P2003-379496

(51) Int. Cl.
*H01L 27/15*    (2006.01)
*H01S 5/00*    (2006.01)

(52) U.S. Cl. .................................... 257/79; 372/46.013

(58) Field of Classification Search .................. 257/79, 257/95, 103, 623; 372/46, 46.013
See application file for complete search history.

(56) References Cited

U.S. PATENT DOCUMENTS

| 5,493,577 | A | * | 2/1996 | Choquette et al. | ..... 372/46.013 |
| 5,719,891 | A | * | 2/1998 | Jewell | ..... 372/46.013 |
| 2004/0099857 | A1 | * | 5/2004 | Song et al. | ..... 257/12 |

* cited by examiner

*Primary Examiner*—Mark V. Prenty
(74) *Attorney, Agent, or Firm*—Sonnenschein Nath & Rosenthal LLP

(57) ABSTRACT

A semiconductor light-emitting device capable of improving device characteristics such as life and reliability is provided. A current confinement layer includes a non-oxidized region made of AlAs or the like corresponding to a current injection region in an active layer, and an oxidized region made of aluminum oxide corresponding to a non-current injection region. The oxidized region is formed by forming a non-oxidized layer made of AlAs or the like and then oxidizing part of the non-oxidized layer at a temperature from 240° C. to less than 375° C. The thickness of the oxidized region is preferably from 10 nm to 1000 nm. The width of the one side of the oxidized region is one time or more of the width of the non-oxidized region or seven times or less thereof The distance between current confinement layer and the active layer is preferably 50 nm or more, or 500 nm or less, and more preferably 180 nm or more.

11 Claims, 9 Drawing Sheets

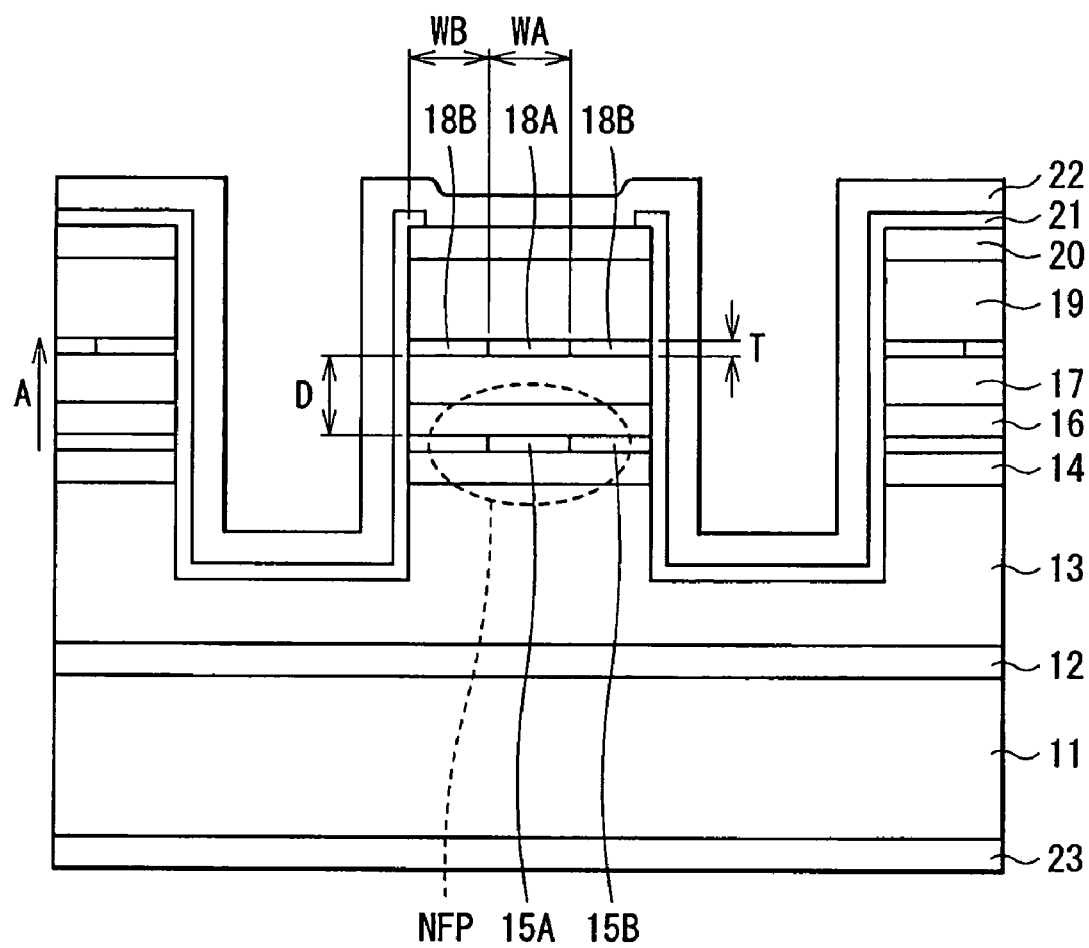
F I G. 2

SEMICONDUCTOR LIGHT-EMITTING DEVICE AND METHOD OF MANUFACTURING THE SAME

RELATED APPLICATION DATA

The present application claims priority to Japanese Application(s) No(s). P2003-379496 filed Nov. 10, 2003, which application(s) is/are incorporated herein by reference to the extent permitted by law.

BACKGROUND OF THE INVENTION

1. Field of the Invention

The present invention relates to a semiconductor light-emitting device including a current confinement layer formed by oxidation and a method of manufacturing the same, and particularly to a semiconductor light-emitting device suitable for a red laser having a wavelength of about 600 nm to 700 nm and a method of manufacturing thereof.

2. Description of the Related Art

A laser diode using AlGaInP as a base material can obtain red emission having a wavelength of 600 nm to 700 nm and is widely used as a light source for a high-density recording by DVD (Digital Versatile Disc) or the like.

The red laser using AlGaInP is generally formed with a strip-shaped ridge by removing part of a p-type semiconductor layer by etching for current confinement. Upon directly forming an electrode on the ridge, leakage current is generated. Therefore, in order to prevent the leakage current, a buried layer including an n-type GaAs layer or a laminated structure of an n-type AlInP layer and an n-type GaAs layer, or an insulating layer made of silicon dioxide ($SiO_2$), silicon nitride (SiN) or the like is formed on a side surface of the ridge.

However, the current confinement by the ridge of the related art has a several problems as mentioned below. For example, n-type GaAs used for a material of the buried layer has a bandgap width of 1.42 eV (873 nm). Therefore, n-type GaAs absorbs the light of a wavelength of 600 nm to 700 nm and absorption loss of the light generated in an active layer becomes large. In addition, a dielectric material such as silicon dioxide has a large difference in a lattice constant with the semiconductor, so the insulating layer formed near the active layer largely distorts the active layer. The absorption loss of the light or the distortion of the active layer increases the amount of oscillation current and largely decreases reliability of the device.

In order to reduce the amount of the oscillation current, a current injection region in the active layer is narrowed by reducing the width of the base of the ridge to reduce the volume of the emission part. However, generally, the ridge is formed by chemical etching, so it is necessary to make the width of the top of the ridge smaller than the width of the base of the ridge. For example, when the width of the base of the ridge is about 2 μm to 3 μm, the width of the top of the ridge is 1.0 μm or less. This results in an increase in operation voltage, thereby power consumption is increased. The increased power consumption largely affects on the device life and this will be a serious problem for a practical application.

To solve these problems, a method that part of a Group III-V compound semiconductor layer containing aluminum (Al) is oxidized by water vapor at a temperature of 375° C. or higher to form the current confinement layer has been proposed (referred to U.S. Pat. Nos. 5,262,360 and 5,373,522; Japanese Patent No. 3,097,863; and J. M. Dallesasse et al., "Native-oxide stripe-geometry $Al_xGa_{1-x}As$-GaAs quantum well heterostructure lasers", Applied Physics Letters, American Institute of Physics, Jan. 28, 1991, vol. 58, No. 4, pp. 394-396).

However, the volume of the current confinement layer formed by oxidation shrinks and generates distortion in the semiconductor layers including the active layer formed above and below the current confinement layer. The distortion adversely affects on the device characteristics and reliability, in particular, the device life is significantly deteriorates. Therefore, when using the current confinement layer formed by oxidation, there is still room for an improvement in conditions such as the device structure and the oxidation temperature.

SUMMARY OF THE INVENTION

In view of the foregoing, it is an object of the invention to provide a semiconductor light-emitting device capable of improving the device characteristics such as life and reliability by use of the current confinement layer formed by oxidation, and a method of manufacturing the same.

A semiconductor light-emitting device of the invention comprises: an active layer; and a current confinement layer restricting a current injection region in the active layer and being provided on a side of the active layer. The current confinement layer includes: a non-oxidized region made of a semiconductor corresponding to the current injection region in the active layer; and an oxidized region having lower conductivity than the non-oxidized region corresponding to a region other than the current injection region in the active layer. After forming a non-oxidized layer made of the semiconductor, the oxidized region is formed by oxidizing part of the non-oxidized layer at a temperature from 240° C. to less than 375° C.

A method of manufacturing a semiconductor light-emitting device of the invention comprises the steps of forming a plurality of semiconductor layers including an active layer and a layer to be a current confinement layer on a substrate; and forming a current confinement layer having a non-oxidized region made of a semiconductor and an oxidized region with a lower conductivity than the non-oxidized region by oxidizing part of a layer to be the current confinement layer at a temperature from 240° C. to less than 375° C.

According to the semiconductor light-emitting device or the method of manufacturing the semiconductor light-emitting device of the invention, the oxidized region in the current confinement layer is formed at an optimal temperature from 240° C. to less than 375° C. Therefore, the device life is improved, thereby improving the device characteristics and reliability.

Other and further objects, features and advantages of the invention will appear more fully from the following description.

BRIEF DESCRIPTION OF THE DRAWINGS

FIG. 2 is a front elevation of the laser diode illustrated in FIG. 1 viewed from an emitting side of laser beam;

DETAILED DESCRIPTION OF THE PREFERRED EMBODIMENTS

Preferred embodiments of the invention will be described in more detail below referring to the accompanying drawings.

Figure 1:
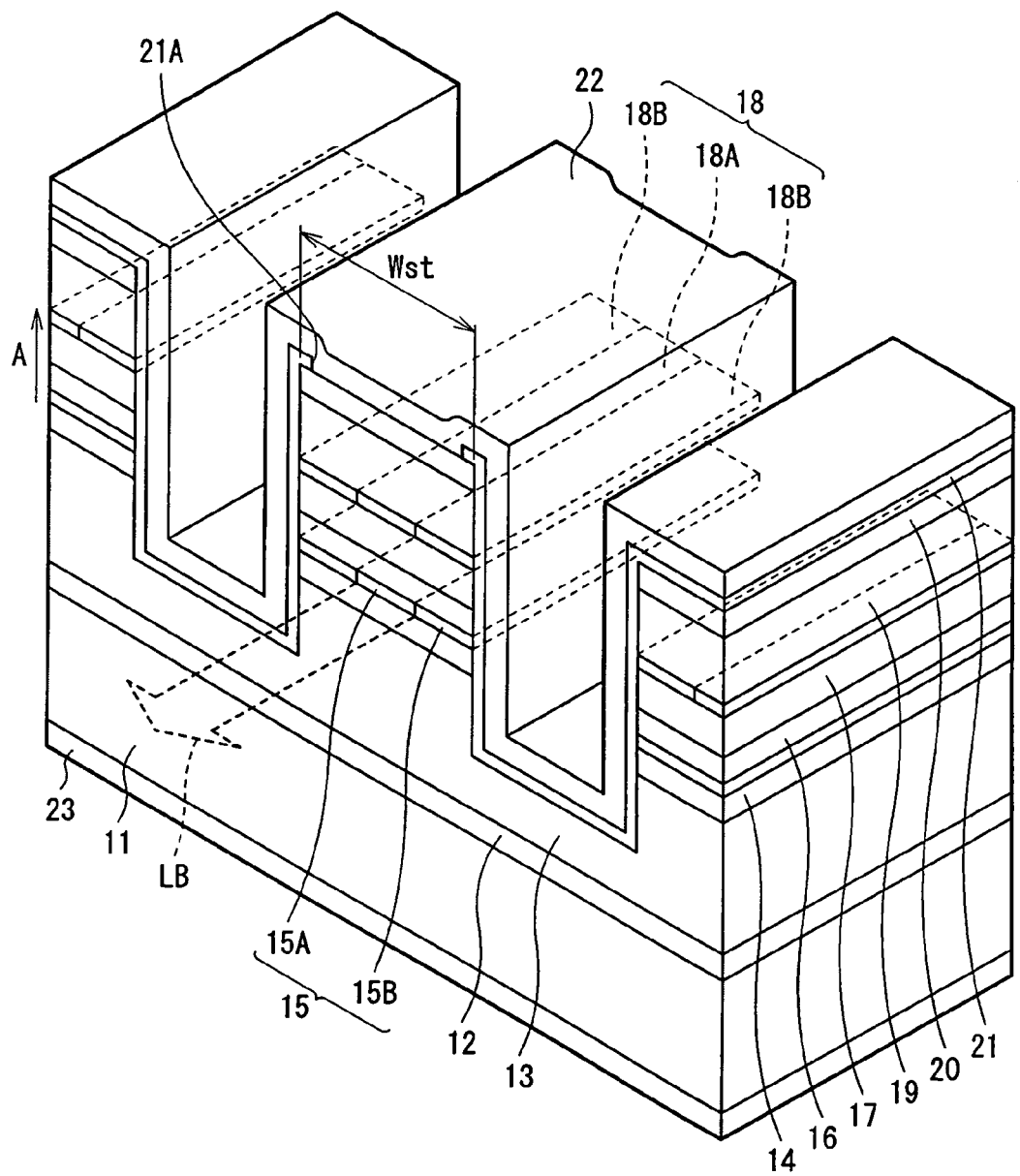
FIG. 1 is a perspective view illustrating a structure of a laser diode according to an embodiment of the invention.

FIG. 1 illustrates a structure of a laser diode according to an embodiment of the invention. The laser diode has a structure laminating a buffer layer 12, an n-type cladding layer 13, an n-type guide layer 14, an active layer 15, a p-type guide layer 16, a first p-type cladding layer 17, a current confinement layer 18, a second p-type cladding layer 19 and a p-side contact layer 20 in this order on one surface of a substrate 11, for example. The laser diode is a red laser using a Group III-V compound semiconductor containing, for example, a Group 3B element and a Group 5B element in a short-period periodic table as a material of the active layer 15. At least one from the Group consisting of aluminum (Al), gallium (Ga) and indium (In) is cited as a Group 3B element and at least one from the Group consisting of nitride (N), phosphorous (P) and arsenic (As) is cited as a Group 5B element.

The laminated structure is etched downward at least to the n-type cladding layer 13 so as to form two parallel grooves, thereby forming three strip-shaped mesas. The middle mesa functions as a laser diode. The width Wst of the middle mesa is preferably from 3 µm to 50 µm and more preferably from 5 µm to 10 µm, for example. This is because the contact area between the p-side contact layer 20 and a p-side electrode 22, which will be described later, can be increased to reduce the contact resistance. This enables to reduce the drive voltage.

The substrate 11 has a thickness of 430 µm in a laminated direction A (hereinafter referred to thickness) and made of n-type GaAs doped with an n-type impurity such as silicon (Si) and selenium (Se). The buffer layer 12 has a thickness of 0.05 µm and made of an n-type GaInP mixed crystal doped with an n-type impurity such as silicon and selenium. The n-type cladding layer 13 has a thickness of 1.4 µm and made of an n-type $(Al_{0.7}Ga_{0.3})_{0.5}In_{0.5}P$ mixed crystal doped with an n-type impurity such as silicon and selenium. The n-type guide layer 14 has a thickness of 0.1 µm and made of an n-type $(Al_{0.47}Ga_{0.53})_{0.5}In_{0.5}P$ mixed crystal not doped with an impurity, or an n-type $(Al_{0.47}Ga_{0.53})_{0.5}In_{0.5}P$ mixed crystal doped with an n-type impurity such as silicon and selenium.

The active layer 15 has a thickness of 30 nm and a multiple quantum well structure alternately laminating a GaInP mixed crystal layer and an AlGaInP mixed crystal layer. The active layer 15 includes a current injection region 15A in which current is injected and a non-current injection region 15B in addition to the current injection region 15A. The current injection region 15A functions as a light-emitting region.

The p-type guide layer 16 has a thickness of 0.1 µm and made of an $(Al_{0.47}Ga_{0.53})_{0.5}In_{0.5}P$ mixed crystal not doped with an impurity, or a p-type $(Al_{0.47}Ga_{0.53})_{0.5}In_{0.5}P$ mixed crystal doped with a p-type impurity such as zinc (Zn) and magnesium (Mg). The first p-type cladding layer 17 is made of a p-type $(Al_{0.7}Ga_{0.3})_{0.5}In_{0.5}P$ mixed crystal doped with a p-type impurity such as zinc and magnesium. The thickness of the first p-type cladding layer 17 is from 0.05 µm to 0.5 µm according to a distance between the current confinement layer 18, which will be described below, and the active layer 15.

The current confinement layer 18 is for restricting the current injection region 15A in the active layer 15 and has a non-oxidized region 18A made of a semiconductor corresponding to the current injection region 15A and an oxidized region 18B having a lower conductivity than the non-oxidized region 18A corresponding to the non-current injection region 15B. The non-oxidized region 18A and the current injection region 15A are formed in a strip shape and the oxidized region 18B is formed in a strip shape on both sides of the non-oxidized region 18A.

The non-oxidized region 18A is made of a Group III-V compound semiconductor containing a Group 3B element and a Group 5B element in a short-period periodic table. As a Group 3B element, at least aluminum (Al), and as a Group 5B element, at least arsenic (As) are contained. Specifically, the non-oxidized region 18A is made of AlAs or AlGaAs and the oxidized region 18B is made of an insulative oxide containing aluminum, for example, aluminum oxide ($AlO_x$). As will be described below, the oxidized region 18B is formed as follows. A non-oxidized layer made of the above Group III-V compound semiconductor such as AlAs and AlGaAs is formed and then part of the non-oxidized layer is oxidized at a temperature from 240° C. or more to less than 375° C.

The second p-type cladding layer 19 has a thickness of, for example 1.1 µm and made of a p-type $(Al_{0.7}Ga_{0.3})_{0.5}In_{0.5}P$ mixed crystal doped with a p-type impurity such as zinc and magnesium. The p-side contact layer 20 has a thickness of 0.3 µm and made of a p-type GaAs doped with a p-type impurity such as zinc and magnesium.

An insulating layer 21 made of, for example silicon dioxide ($SiO_2$) or silicon nitride (SiN) is formed on a surface of the p-side contact layer 20. An aperture 21A is formed on the top of the middle mesa in the insulating layer 21.

The p-side electrode 22 is formed on a surface of the insulating layer 21. The p-side electrode 22 has a laminated structure in which titanium (Ti), platinum (Pt) and gold (Au) are sequentially formed, and electrically connected to the p-side contact layer 20 through the aperture 21A in the insulating layer 21. In this embodiment, the width Wst of the middle mesa is wide and the current confinement is performed by the oxidized region 18B of the current confinement layer 18, so that the contact area of the p-side contact layer 20 and the p-side electrode 22 can be widened. It is preferable to increase the contact area thereof as large as possible. This is because the contact resistance and the drive voltage can be reduced.

An n-side electrode 23 is formed on the other side of the substrate 11. The n-side electrode 23 has a structure in which AuGe:Ni and gold are sequentially deposited and the deposition is alloyed by heat treatment and is in electrically contact with the substrate 11.

Further, in the laser diode, a pair of side surfaces facing in the resonator direction are resonator end faces and a pair of reflective mirror film (not illustrated) are respectively formed on the resonator end faces. One of the reflective mirror films is adjusted to have a low reflectance and the other is adjusted to have a high reflectance. Therefore, the light generated in the active layer 15 is amplified by traveling between the reflective mirror films and emitted from the reflective mirror film having a low reflectance as laser beam LB in a direction perpendicular to the laminated direction A.

FIG. 2 is a front elevation illustrating a structure of the laser diode illustrating FIG. 1 viewed from the emitting side of the laser beam LB. The thickness T of the oxidized portion 18B in the laminated direction A is preferably from 10 nm to 1000 nm. The thickness T smaller than 10 nm deteriorates the current blocking function of the oxidized region 18B. On the other hand, the thickness T larger than 1000 nm may deteriorate the withstand voltage characteristics. More preferably, the thickness T is from 30 nm to 60 nm. The thickness of the non-oxidized region 18A is substantially the same as that of the oxidized region 18B.

The width WA of the non-oxidized region 18A is preferably about 2 μm. The width WB of the oxidized region 18B on one side of the non-oxidized region 18A is one time or more of the width WA of the non-oxidized region 18A. Since NFP (Near Field Pattern) of the laser beam LB is widened about three times of the width WA of the non-oxidized region 18A, that is, the width of the current injection region 15A, one time or more of the width WB of the oxidized region 18B on one side of the non-oxidized region 18A can prevent the absorption loss of the laser beam LB caused by NFP reaching a wiring portion on a side of the mesa.

The width WB of the oxidized region 18B is preferably seven times or less of the width WA of the non-oxidized region 18A. The width WB larger than seven times of the width WA is largely affected by distortion of the oxidized region 18B. This accelerates the degradation of device characteristics.

The distance D between the current confinement layer 18 and the active layer 15 is preferably 50 nm or more. If the distance D is smaller than 50 nm, the manufacturing yield may be lowered. More preferably, the distance D is 180 nm or more. This is because the absorption coefficient is lowered, thereby the absorption loss of the laser beam LB can be suppressed.

The distance D is preferably 500 nm or less. If the distance D is larger than 500 nm, leakage current is increased. This results in an increase in the amount of the oscillation current.

The laser diode can be manufactured as follows.

Figure 3A:
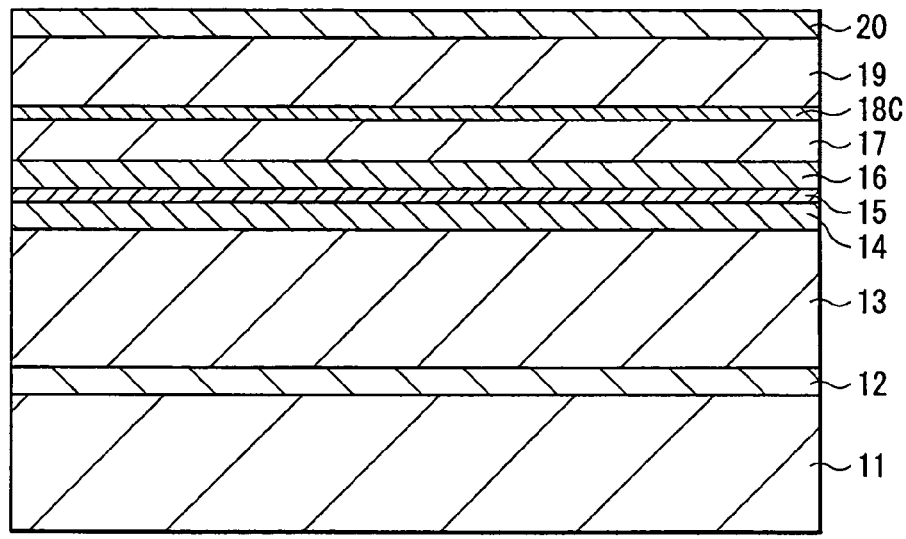
FIGS. 3A and 3B are cross sectional views illustrating a method of manufacturing the laser diode shown in FIG. 1 in order of process.

FIGS. 3A and 3B through FIGS. 7A and 7B illustrate a method of manufacturing the laser diode according to the embodiment in order of steps. First, as illustrated in FIG. 3A, the substrate 11 having the above-described thickness and made of the above-described material is prepared. The buffer layer 12, the n-type cladding layer 13, n-type guide layer 14, the active layer 15, the p-type guide layer 16 and the first p-type cladding layer 17 are sequentially grown on one side of the substrate 11 by MOCVD (Metal Organic Chemical Vapor Deposition).

Then, as illustrate in FIG. 3A, a non-oxidized layer 18C made of the above Group III-V compound semiconductor is formed on the first p-type cladding layer 17. On the non-oxidized layer 18C, the second p-type cladding layer 19 and the p-side contact layer 20 are sequentially grown.

Figure 3B:
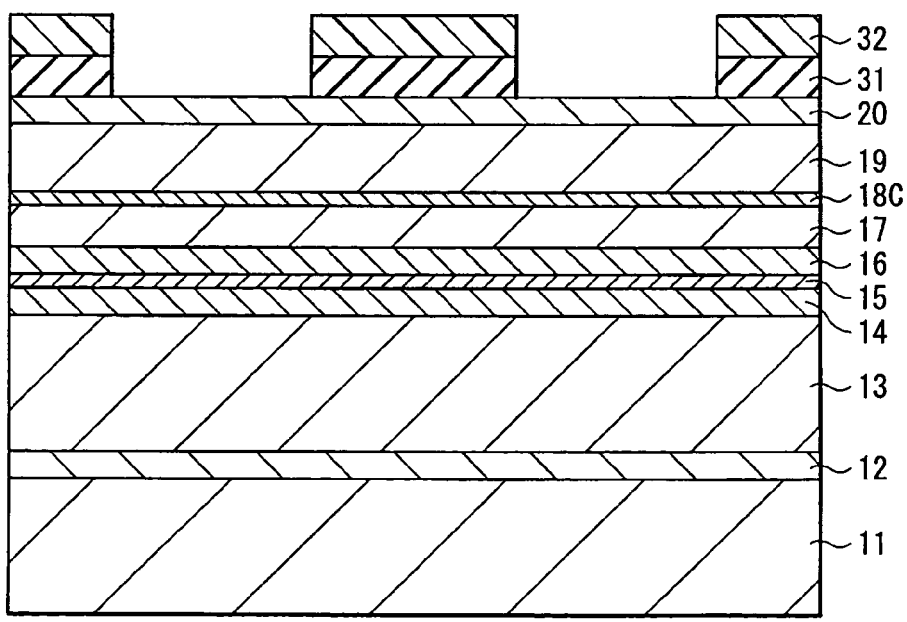

As illustrated in FIG. 3B, a mask layer 31 and a photoresist layer 32 made of silicon dioxide are formed on the p-side contact layer 20. After that, using the photoresist layer 32, the mask layer 31 is selectively removed by photolithography technique to expose the p-side contact layer 20.

Figure 4A:
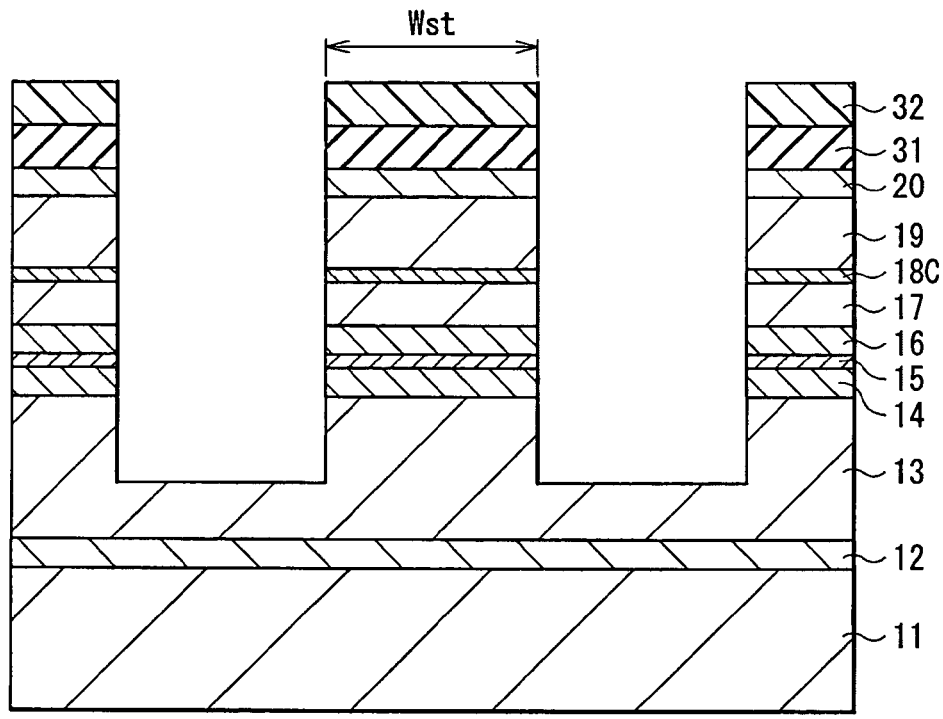
FIGS. 4A and 4B are cross sectional views illustrating steps following the step shown in FIG. 3B.

As illustrated in FIG. 4A, parts of the p-side contact layer 20, the second p-type cladding layer 19, the non-oxidized layer 18C, the first p-type cladding layer 17, the p-type guide layer 16, the active layer 15, the n-type guide layer 14 and the n-type cladding layer 13 are selectively removed by reactive ion etching or the like through an aperture in the mask layer 31 to form three strip-shaped mesas. The depth of the grooves is preferably the depth capable to expose the non-oxidized layer 18C on the side surface of the middle mesa. The width Wst of the middle mesa is preferably from 3 μm to 50 μm, and more preferably from 5 μm to 10 μm as described above. With this range, the contact area of the p-side contact layer 20 and the p-side electrode 22 can be increased to lower the contact resistance, thereby lowering the drive voltage. After that, the photoresist layer 32 is removed.

Figure 4B:
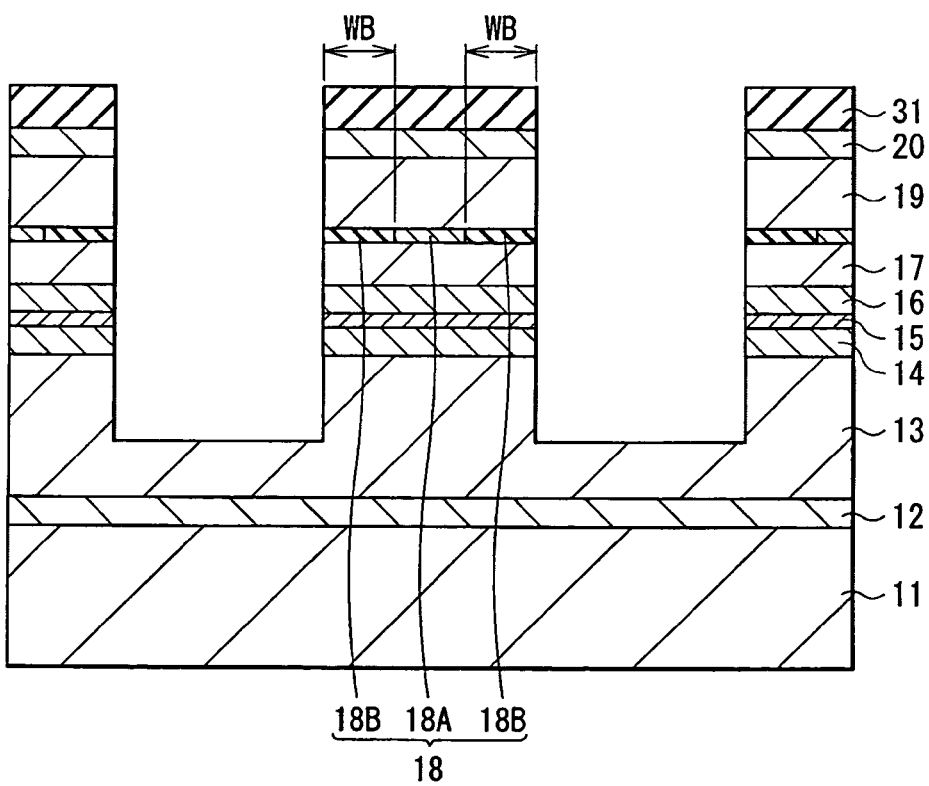

After removing the photoresist layer 32, as illustrated in FIG. 4B, part of the non-oxidized layer 18C is oxidized by heating in an atmosphere of steam to form the current confinement layer 18 having the non-oxidized region 18A and the oxidized region 18B. The oxidation temperature is from 240° C. or more to less than 375° C., for example. The temperature of 375° C. or higher deteriorates aging properties extremely; therefore reliability such as life significantly deteriorates as will be described in the examples. The temperature of less than 240° C. slows the oxidation rate to less than about 0.1 nm/sec. In the result, it requires long time for forming the oxidized region 18B.

Figure 5:
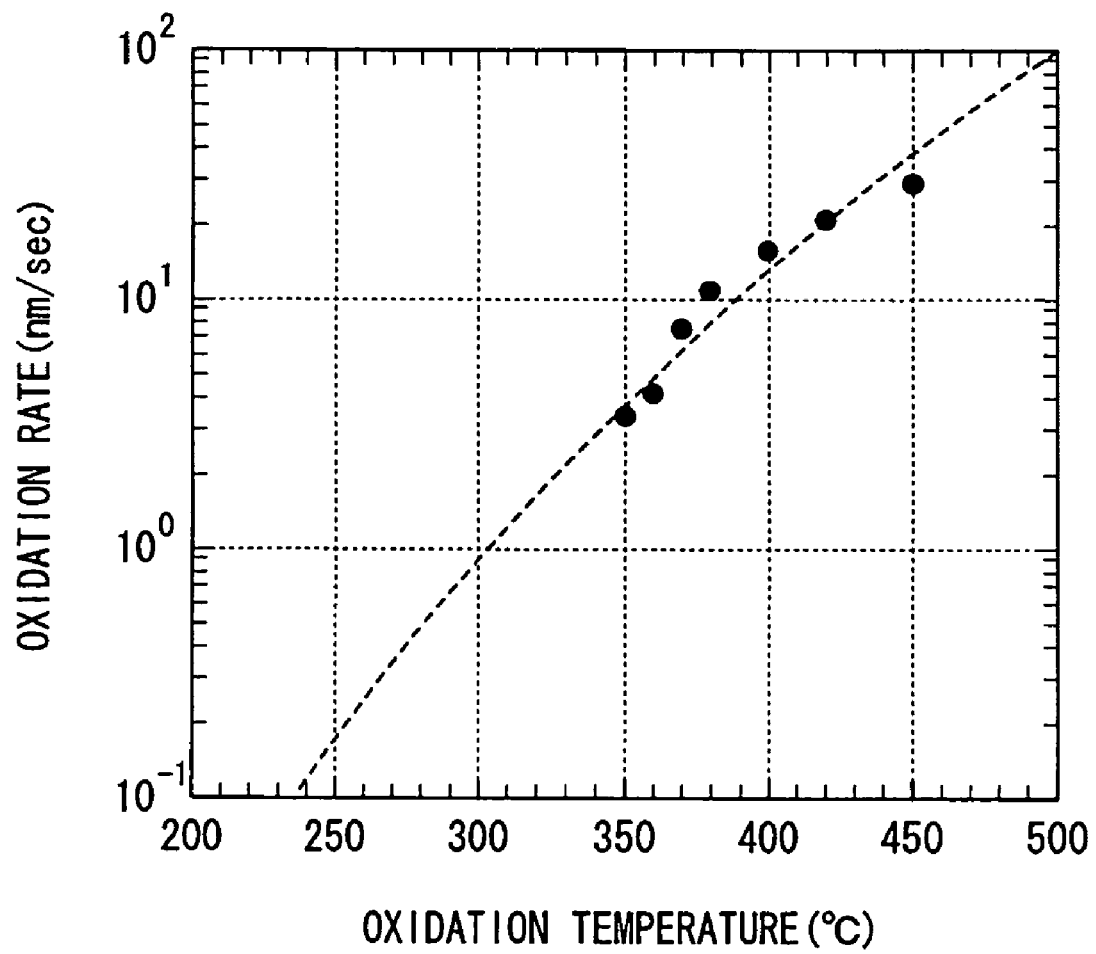
FIG. 5 illustrates a relation between an oxidation temperature and oxidation rate.

In other words, in case where the oxidation rate is 0.1 nm/sec, the time required for forming the oxidized region 18B with the width WB of 1 μm is about 2.7 hours. For forming the oxidized region 18B with the width WB of 50 μm, it takes about 138 hours. From the results, it is difficult and unrealistic to perform oxidation at an oxidation rate less than 0.1 nm/sec. When examine the temperature at an oxidation rate of about 0.1 nm/sec, the oxidation rate is about 0.1 nm/sec at 240° C. as shown in FIG. 5. Therefore it was found that the lower limit of the oxidation temperature is about 240° C.

Further, the oxidation temperature is preferably from 300° C. to 370° C., and more preferably from 320° C. to 365° C.

The width WB of the oxidized region 18B can be controlled by stopping oxidation after the required time calculated in advance has passed or after obtaining an appropriate width WB by observing the progression of oxidation with monitor or the like.

Figure 6A:
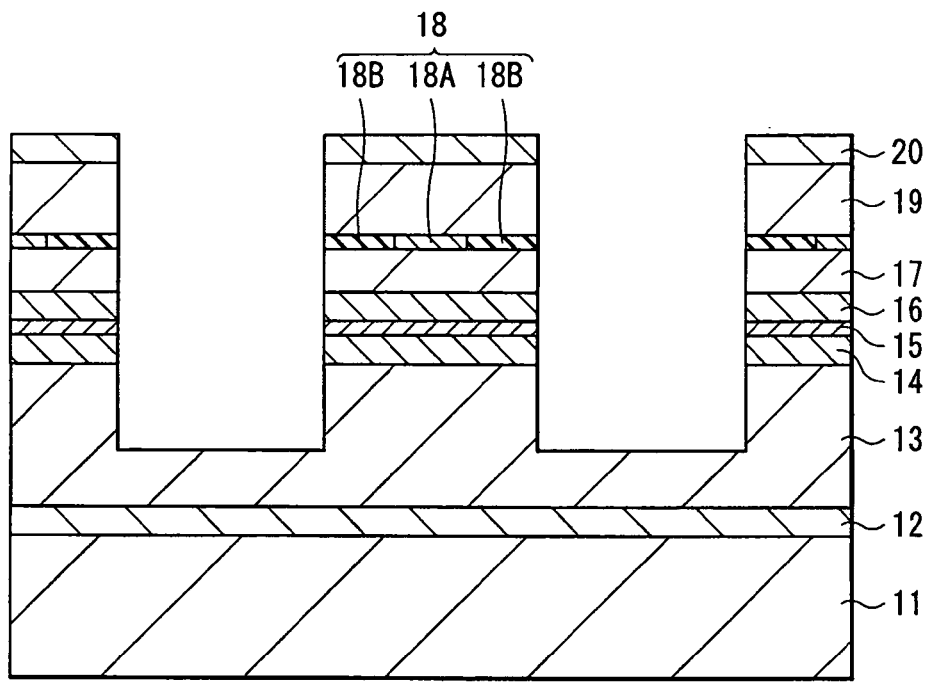
FIGS. 6A and 6B are cross sectional views illustrating steps following the step shown in FIG. 4B.
Figure 6B:
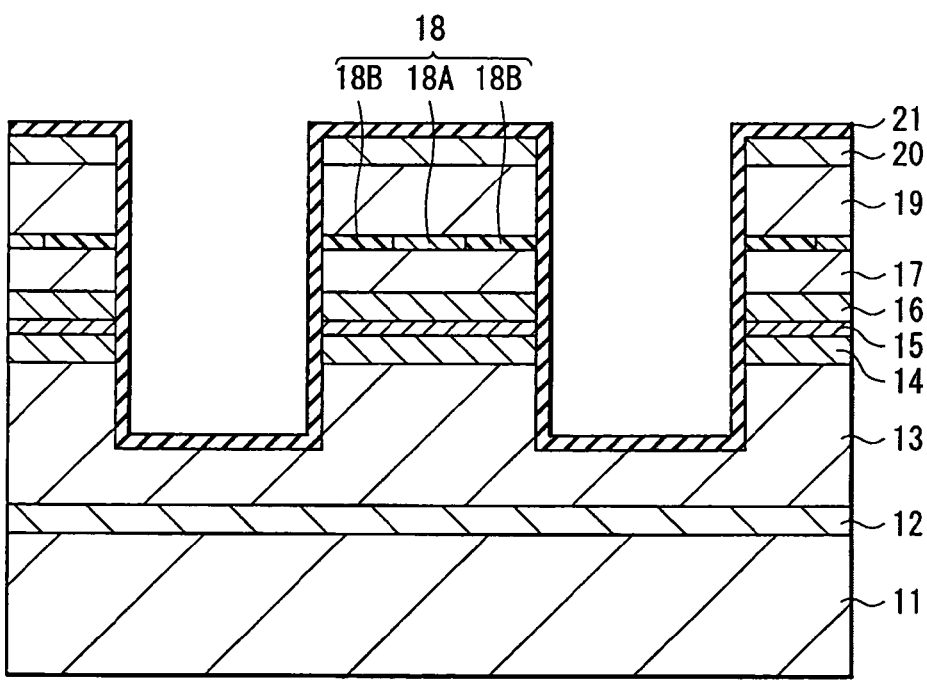

After forming the current confinement layer 18 having the non-oxidized region 18A and the oxidized region 18B, as illustrated in FIG. 6A, the mask layer 31 is removed and as illustrated in FIG. 6B, the insulating layer 21 made of the above materials is formed on the whole surface of the substrate 11 by deposition.

Figure 7A:
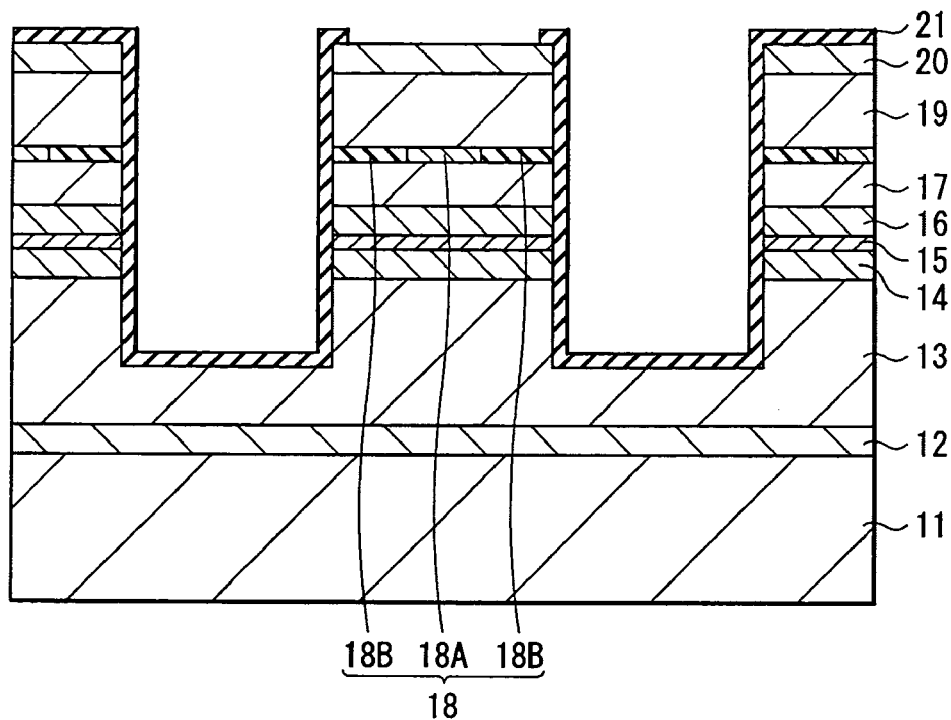
FIGS. 7A and 7B are cross sectional views illustrating steps following the step shown in FIG. 6B.

After forming the insulating layer 21, as illustrate in FIG. 7A, a photoresist layer (not shown) is formed on the insulating layer 21 and patterned by, for example, photolithography. Then, the insulating layer 21 is selectively removed by etching or dry etching with chemical etchant using the photoresist layer as a mask to form an aperture on the top of the middle mesa. After that, the photoresist layer is removed.

Figure 7B:
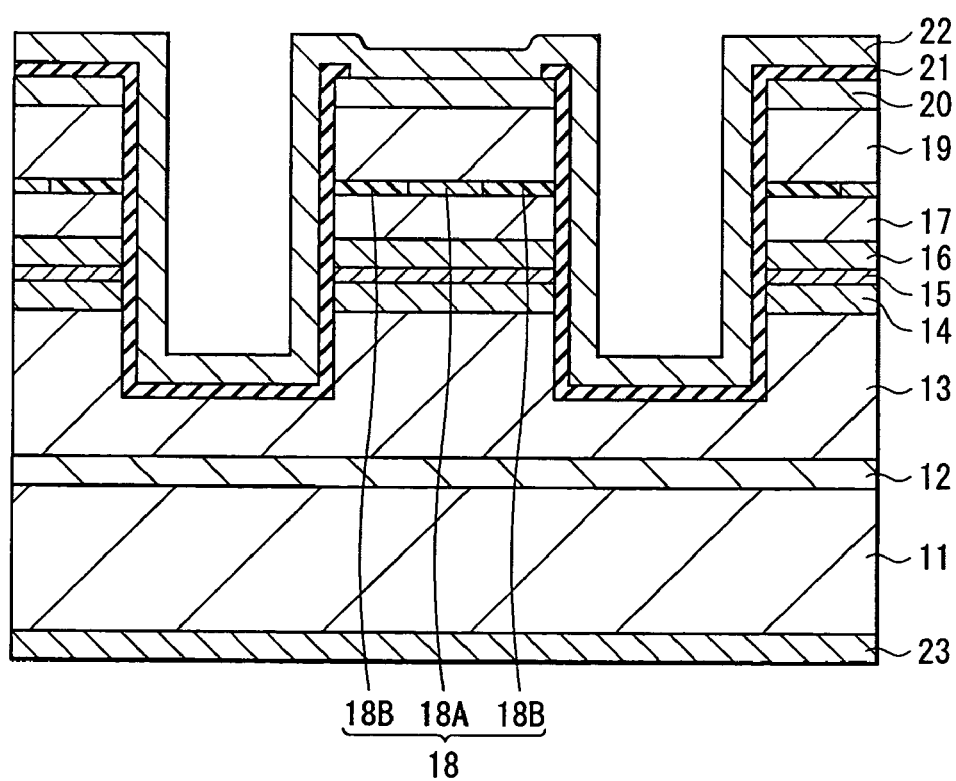

After forming the aperture in the insulating layer 21, as illustrated in FIG. 7B, the p-side electrode 22 is formed on the whole top surface of the substrate 11 by sequentially depositing titanium, platinum and gold by vacuum deposition, and alloying. After forming the p-side electrode 22, the substrate 11 is grinded to have a predetermined thickness and as illustrated in FIG. 7B, like the p-side electrode 22, the n-side electrode 23 is formed on the whole surface of the substrate 11 opposite to the p-side electrode 22 by sequentially depositing gold, AuGe and gold by vacuum deposition, and alloying.

After forming the n-side electrode 23 and the p-side electrode 22, the substrate 11 is adjusted to a predetermined size and the reflective mirror films (not shown) are formed on end faces of the pair of resonators facing in the resonator length direction. Thereby, the laser diode illustrated in FIG. 1 is completed.

In the laser diode, when a certain voltage is applied between the n-side electrode 23 and the p-side electrode 22, the current confinement is performed by the oxidized region 18B of the current confinement layer 18 and current is injected in the current injection region 15A of the active layer 15. Thereby, the emission is generated by the electron-hole recombination. The light is reflected by a pair of reflective mirror films, travels therebetween to generate laser oscillation, and is emitted outside as the laser beam LB. Since the oxidized region 18B of the current confinement layer 18 is formed with an appropriate temperature condition, that is from 240° C. or more to less than 375° C., the device has a long life.

As described, in the embodiment, since the oxidized region 18B of the current confinement layer 18 is formed with an appropriate temperature condition, the device has a long life, and the device characteristics and reliability can be improved.

In addition, in the embodiment, the current confinement layer 18 formed by oxidation is used. As a result, the width Wst of the middle mesa can be widened. Therefore, the contact area between the p-side contact layer 20 and the p-side electrode 22 is increased, the contact resistance is lowered, and the amount of the oscillation current can be reduced. Further, it is unnecessary to provide a buried layer, which is conventionally provided. Therefore, the crystal growth process is simplified and a reduction in the manufacturing cost can be expected. Further, in the embodiment, an etching stop layer, which is conventionally required for forming the ridge, is unnecessary. As a result, the light confinement efficiency is increased and the amount of the oscillation current can be lowered. Furthermore, in the embodiment, with the current confinement layer 18 formed by oxidation, compared to the conventional structure using the current confinement formed by the ridge, TE/TM (Transverse electric/Transverse magnetic) polarization ratio can be increased and the S/N (Signal to Noise) ratio can be improved.

In the embodiment, the thickness T of the oxidized region 18B in the laminated direction A is from 10 nm to 1000 nm. As a result, the current blocking function of the oxidized region 18B and the withstand voltage are enhanced.

Further in the embodiment, the width WB of the oxidized region 18B on one side of the non-oxidized region 18A is one time or more of the width WA of the non-oxidized region 18A. As a result, the absorption loss of the laser beam LB is prevented and therefore, the amount of the oscillation current is reduced.

In addition, in the embodiment, the width WB of the oxidized region 18B on one side of the non-oxidized region 18A is seven times or less of the width WA of the non-oxidized region 18A. Therefore, the influence of the distortion of the oxidized region 18B can be reduced and the device characteristics can be improved.

Furthermore, in the embodiment, the distance D between the current confinement layer 18 and the active layer 15 is 50 nm or more. This enables to enhance the manufacturing yield. If the distance D is 180 nm or more, the absorption coefficient is reduced and therefore, the absorption loss of the laser beam LB is prevented and the amount of the oscillation current is reduced.

Additionally, in the embodiment, the distance D is 500 nm or less. As a result, the leakage current is prevented and the amount of the oscillation current is reduced.

EXAMPLE

Concrete examples of the invention will be described hereinafter.

Example 1

Similar to the above embodiment, a laser diode was fabricated. The oxidation temperature for forming the oxidized region 18B was 360° C. Accelerated aging test was conducted on the obtained laser diode. The current was not passed from the start (0 h) to 0.5 h after and the temperature was kept at 25° C. The current was not passed from 0.5 h after the start to 2.5 h after and the temperature was raised from 25° C. to 70° C. The current was passed 2.5 h after the start at 70° C. The results are shown in FIG. 8.

Comparative Example 1

A laser diode was fabricated as in the case of Example 1, except that the oxidation temperature was set at 375° C. The accelerated aging test was conducted like Example 1 on the obtained laser diode. The results are shown in. FIG. 8 as well. In Comparative Example 1, the accelerated aging test was conducted twice with the same condition and the same results were obtained.

Figure 8:
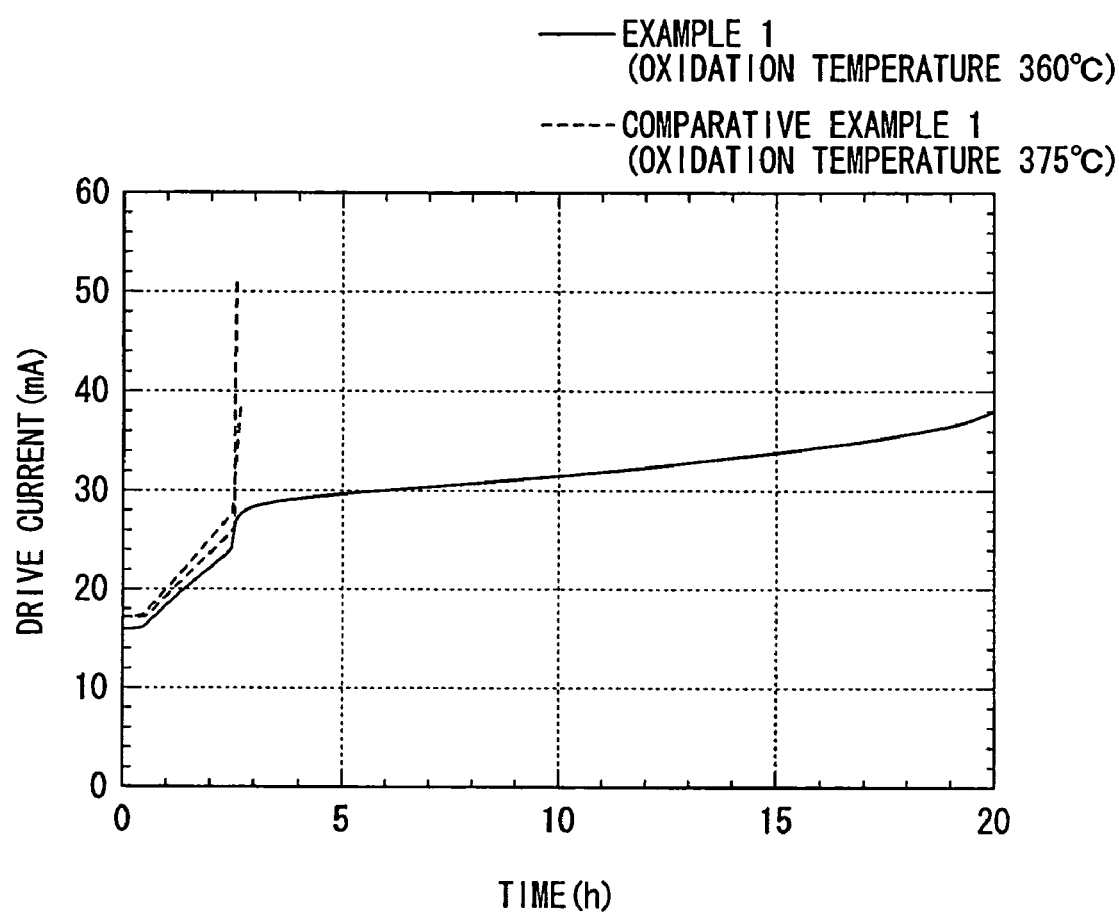
FIG. 8 illustrates results of the example of the invention.

As can be seen from FIG. 8, a raise in drive current after starting power distribution was slow in Example 1. However, in Comparative Example 1, the drive current was raised sharply at the start of power distribution and it was impossible to drive. In other words, it was found that when the oxidized region 18B of the current confinement layer 18 was oxidized at 360° C. or lower, the aging characteristics were significantly improved and the device characteristics such as life and reliability were improved. Example 1 was conducted at 360° C., but if it was conducted at less than 375° C., the aging characteristics would be improved compare to Comparative Example 1. It is preferable that the lower limit of the oxidation temperature is 240° C. or more considering the oxidation rate and the requiring time.

Examples 2 to 4

Figure 9:
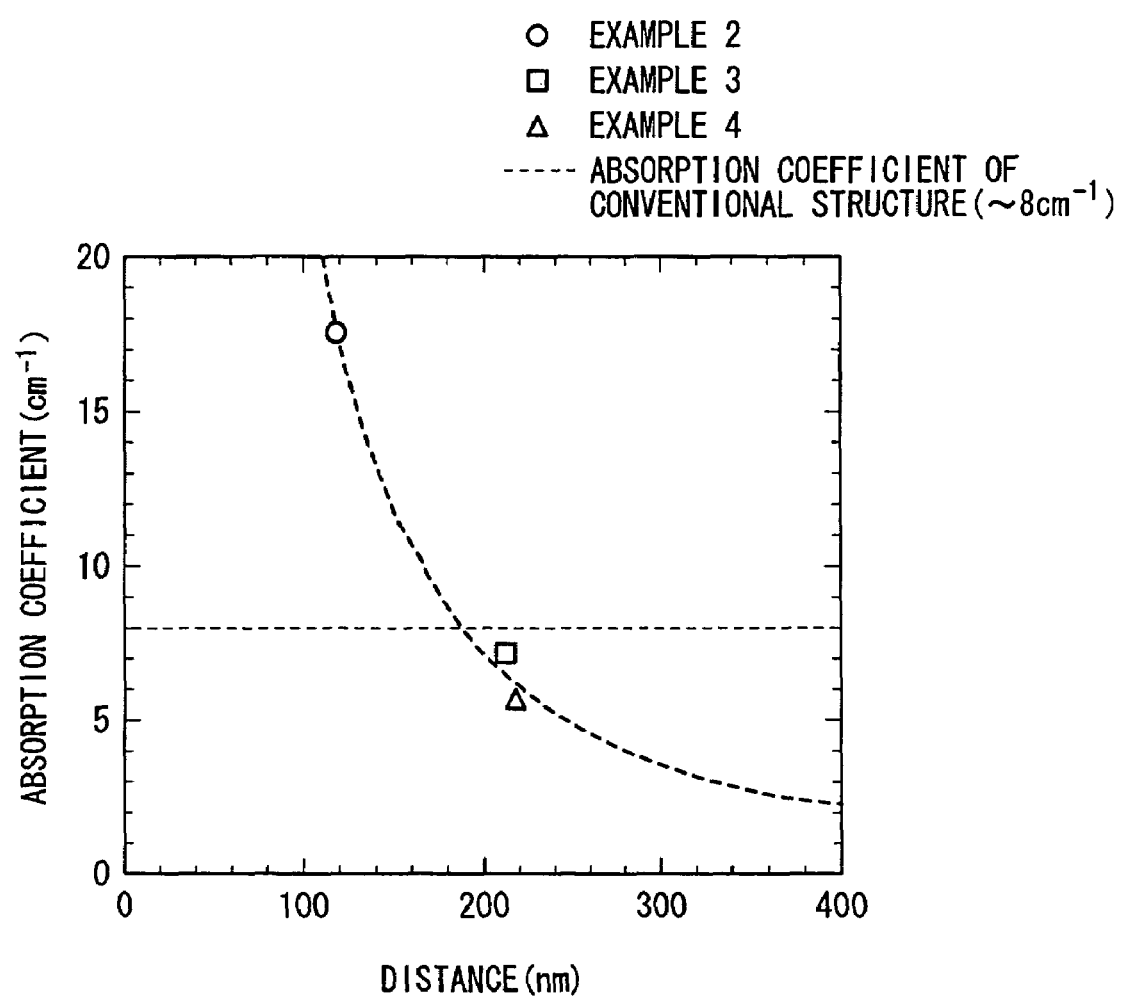
FIG. 9 illustrates results of the example of the invention.

Like the embodiment, laser diodes were fabricated. The distance D between the active layer 15 and the current confinement layer 18 was 120 nm in Example 2, 210 nm in Example 3 and 220 nm in Example 4. Absorption coefficient was examined on the laser diodes of Example 2 to 4. The results are shown in FIG. 9 together with a curve representing the correlation relation of distance D and the absorption coefficient on the basis of the results of Examples 2 to 4. The absorption coefficient in the laser diode using the current confinement by conventional ridge is 8 cm$^{-1}$ or less. This is also shown in FIG. 9.

As can be seen from FIG. 9, the absorption coefficients of Example 3 having the distance D between the active layer 15 and the current confinement layer 18 of 210 nm and Example 4 having the distance D of 220 nm were lower compared to that of the conventional structure. On the other hand, the absorption coefficient of Example 2 having the distance D of 120 nm was higher than that of the conventional structure. The distance D having the same absorption coefficient as the conventional structure, which is 8 cm$^{-1}$, was about 180 nm. In other words, it was found that when the distance D between the active layer 15 and the current confinement layer 18 was 180 nm or more, the absorption coefficient could be lowered compared to the conventional structure.

The present invention is described referring to the embodiments and the examples, but the invention is not limited to the embodiments and the examples, and is variously modified. For example, in the embodiments and examples, the current confinement layer 18 is provided between the first p-type cladding layer 17 and the second p-type cladding layer 19. However, the current confinement layer 18 can be provided in the n-type cladding layer 13, for example. It is desirable that the current confinement layer 18 is provided in the p-type semiconductor layer because the p-type semiconductor layer has a larger specific resistance.

In the embodiments and examples, the first p-type cladding layer 17, the current confinement layer 18 and the second p-type cladding layer 19 are directly laminated. However, a middle layer made of AlGaAs mixed crystal or the like can be provided between the first p-type cladding layer 17 and the current confinement layer 18, or between the current confinement layer 18 and the second p-type cladding layer 19. Such a middle layer is preferable because it can reduce a difference in lattice constant between the current confinement layer 18 and the first cladding layer 17 or the second p-type cladding layer 19.

Further, materials, thicknesses, deposition methods and deposition conditions of each layer described in the embodiments and examples are not limited to the above and other materials, thicknesses, deposition methods and deposition conditions can be applied. For example, the material of the active layer 15 can be AlInP.

Furthermore, in the embodiments and examples, the structure of the laser diode is concretely described. However, it is not necessary to include all the layers and other layers can be further included.

The present invention is applicable not only to an edge-emitting laser diode as illustrated in FIG. 1 but also to a VCSEL (Vertical-Cavity Surface Emitting Laser).

The semiconductor light-emitting device of the invention is applicable to, for example, a light source for optical fiber communications or optical wirings, a light source for laser printers and optical discs.

Obviously many modifications and variations of the present invention are possible in the light of the above teachings. It is therefore to be understood that within the scope of the appended claims the invention may be practiced otherwise than as specifically described.

What is claimed is:

1. A semiconductor light-emitting device comprising:
an active layer having a current injection region; and
a current confinement layer restricting the current injection region in the active layer and being provided on a side of the active layer, the current confinement layer including a non-oxidized region made of a semiconductor corresponding to the current injection region in the active layer; and an oxidized region having lower conductivity than the non-oxidized region corresponding to a region other than the current injection region in the active layer, the oxidized region being formed by forming a non-oxidized layer made of the semiconductor and then oxidizing part of the non-oxidized layer at a temperature from 240° C. to less than 375° C., wherein,
the width of the oxidized region on one side of the non-oxidized region is greater than or equal to the width of the non-oxidized region,
the non-oxidized region and the current injection region are formed in strip shape and the oxidized region is formed in strip shape on both sides of the non-oxidized region, and
a distance between the current confinement layer and the active layer is 50 nm or more.

2. A semiconductor light-emitting device according to claim 1, wherein light generated in the active layer is emitted to a direction perpendicular to a laminated direction of the active layer and the current confinement layer.

3. A semiconductor light-emitting device according to claim 1, wherein a thickness of the oxidized region in the laminated direction of the active layer and the current confinement layer is from 10 nm to 1000 nm.

4. A semiconductor light-emitting device according to claim 1, wherein a thickness of the oxidized region in the laminated direction of the active layer and the current confinement layer is from 30 nm to 60 nm.

5. A semiconductor light-emitting device according to claim 1, wherein the width of the oxidized region on one side of the non-oxidized region is seven times or less of the width of the non-oxidized region.

6. A semiconductor light-emitting device according to claim 1, wherein the active layer is made of a Group III-V compound semiconductor containing at least one kind from aluminum (Al), gallium (Ga) and indium (In) among Group 3B elements and at least one kind from nitrogen (N), phosphorus and arsenic (As) among Group 5B elements.

7. A semiconductor light-emitting device according to claim 1, wherein the non-oxidized region is made of a Group III-V compound semiconductor containing at least aluminum (Al) among Group 3B elements and arsenic (As) among Group 5B elements, and the oxidized region is made of an insulating oxide containing aluminum (Al).

8. A semiconductor light-emitting device comprising:
an active layer having a current injection region; and
a current confinement layer restricting the current injection region in the active layer and being provided on a side of the active layer, the current confinement layer including a non-oxidized region made of a semiconductor corresponding to the current injection region in the active layer; and an oxidized region having lower conductivity than the non-oxidized region corresponding to a region other than the current injection region in the active layer, the oxidized region being formed by forming a non-oxidized layer made of the semiconductor and then oxidizing part of the non-oxidized layer at a temperature from 240° C. to less than 375° C., wherein,
the width of the oxidized region on one side of the non-oxidized region is greater than or equal to the width of the non-oxidized region,
the non-oxidized region and the current injection region are formed in strip shape and the oxidized region is formed in strip shape on both sides of the non-oxidized region, and
a distance between the current confinement layer and the active layer is 180 nm or more.

9. A semiconductor light-emitting device comprising:
an active layer having a current injection region; and
a current confinement layer restricting the current injection region in the active layer and being provided on a side of the active layer, the current confinement layer including a non-oxidized region made of a semiconductor corresponding to the current injection region in the active layer; and an oxidized region having lower conductivity than the non-oxidized region corresponding to a region other than the current injection region in the active layer, the oxidized region being formed by forming a non-oxidized layer made of the semiconductor and then oxidizing part of the non-oxidized layer at a temperature from 240° C. to less than 375° C., wherein, the width of the oxidized region on one side of the non-oxidized region is greater than or equal to the width of the non-oxidized region, the non-oxidized region and the current injection region are formed in strip shape and the oxidized region is formed in strip shape on both sides of the non-oxidized region, and a distance between the current confinement layer and the active layer is 500 nm or less.

10. A semiconductor light-emitting device comprising:

an active layer having a current injection region; and a current confinement layer restricting the current injection region in the active layer and being provided on a side of the active layer, the current confinement layer including a non-oxidized region made of a semiconductor corresponding to the current injection region in the active layer; and an oxidized region having lower conductivity than the non-oxidized region corresponding to a region other than the current injection region in the active layer, the oxidized region being formed by forming a non-oxidized layer made of the semiconductor and then oxidizing part of the non-oxidized layer at a temperature from 240° C. to less than 375° C., wherein, the width of the oxidized region on one side of the non-oxidized region is greater than or equal to the width of the non-oxidized region, the non-oxidized region and the current injection region are formed in strip shape and the oxidized region is formed in strip shape on both sides of the non-oxidized region, and a middle mesa, wherein the width of the middle mesa is at least 3 μm to at most 50 μm.

11. A semiconductor light-emitting device, comprising:

an active layer having a current injection region;

a current confinement layer restricting the current injection region in the active layer and being provided on a side of the active layer, the current confinement layer including a non-oxidized region made of a semiconductor corresponding to the current injection region in the active layer; and an oxidized region having lower conductivity than the non-oxidized region corresponding to a region other than the current injection region in the active layer, the oxidized region being formed by forming a non-oxidized layer made of the semiconductor and then oxidizing part of the non-oxidized layer at a temperature from 240° C. to less than 375° C.;

a cladding layer; and a middle layer provided between the current confinement layer and the cladding layer for reducing a difference in lattice constant, wherein, the width of the oxidized region on one side of the non-oxidized region is greater than or equal to the width of the non-oxidized region, and the non-oxidized region and the current injection region are formed in strip shape and the oxidized region is formed in strip shape on both sides of the non-oxidized region.

* * * * *